United States Patent [19]

Van Deursen

[11] 4,285,066
[45] Aug. 18, 1981

[54] RECEIVER HAVING A SEARCH TUNING CIRCUIT

[75] Inventor: Theodorus H. M. Van Deursen, Eindhoven, Netherlands

[73] Assignee: U.S. Philips Corporation, New York, N.Y.

[21] Appl. No.: 110,290

[22] Filed: Jan. 7, 1980

[30] Foreign Application Priority Data

Jan. 17, 1979 [NL] Netherlands ..................... 7900350

[51] Int. Cl.³ .............................................. H03J 7/22
[52] U.S. Cl. ..................................... 455/166; 455/165; 455/185
[58] Field of Search ............... 455/161, 164, 165, 166, 455/168, 169, 185, 186

[56]     References Cited
U.S. PATENT DOCUMENTS 3,961,261  6/1976  Pflasterer ............................. 455/165
4,009,442  2/1977  Von Brömssen .................... 455/166

FOREIGN PATENT DOCUMENTS 2544511  4/1976  Fed. Rep. of Germany ........... 455/169

Primary Examiner—Marc E. Bookbinder
Attorney, Agent, or Firm—Thomas A. Briody; William J. Streeter; Edward W. Goodman

[57]     ABSTRACT

In a receiver having a search tuning circuit by means of which a group of tuning data, corresponding to predetermined transmitters, can be searched, a frequency detector is used in addition to a field strength detector to enable a rapid restarting of a search action if the search stopped at a transmitter having a frequency which deviates somewhat from the desired frequency.

5 Claims, 1 Drawing Figure

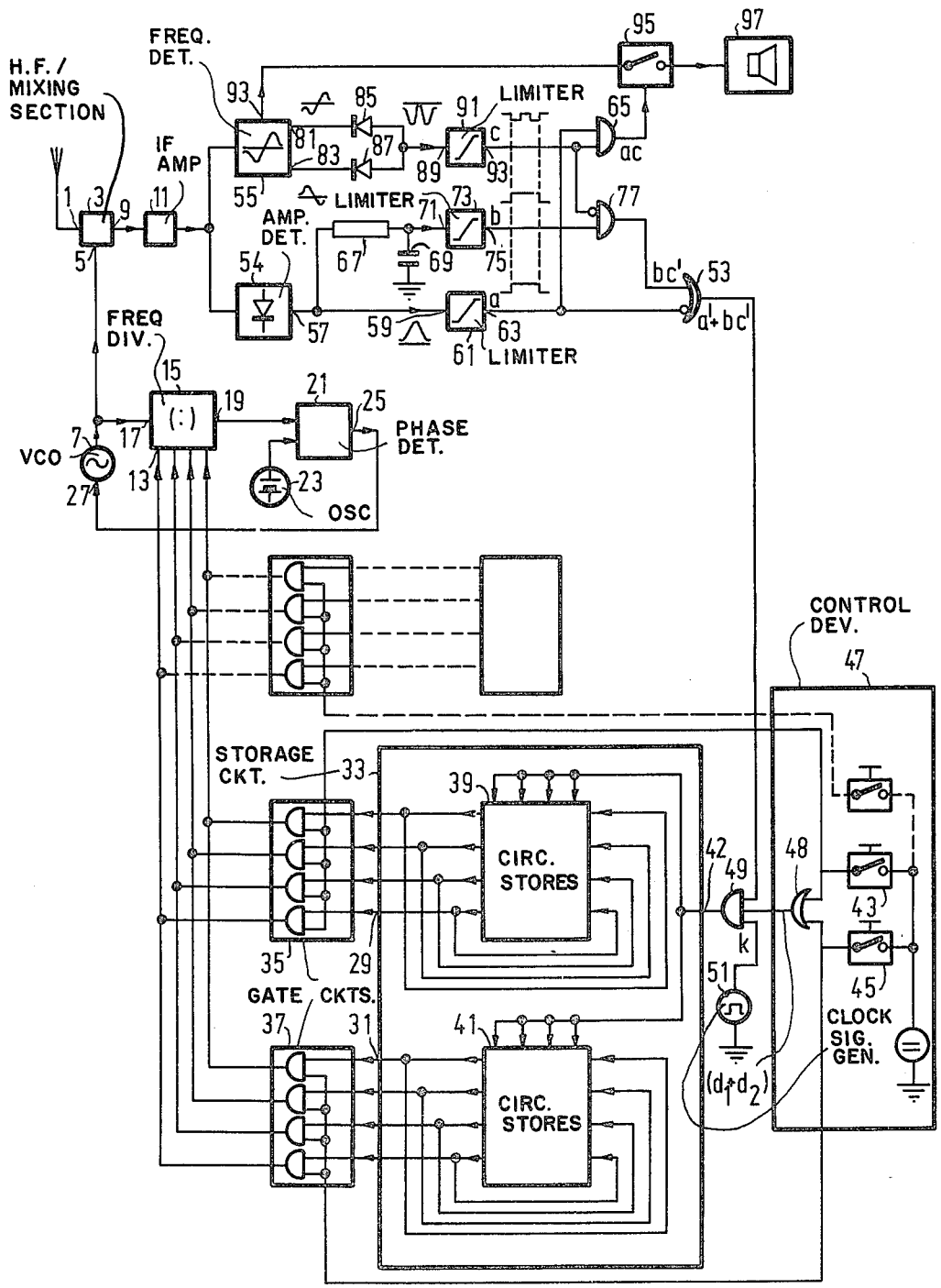

RECEIVER HAVING A SEARCH TUNING CIRCUIT

BACKGROUND OF THE INVENTION

The invention relates to a receiver having a search tuning circuit for tuning the receiver each time to a next tuning datum from a group of tuning data stored in a storage circuit, it being possible to stop a search action of the search tuning circuit under the influence of a reception condition signal which depends on the field strength of a received transmitter.

Netherlands Patent Application 7,413,161 (PHN 7771) describes a receiver of the above-mentioned type. A search action of this receiver may sometimes stop when receiving a transmitter the frequency of which does not correspond to the tuning datum to which the search circuit has tuned the receiver. This could be prevented by deriving the signal, which depends on the field strength of the received transmitter from a selective network produces a voltage in only a very limited frequency range. However, this might result in a slow search action.

SUMMARY OF THE INVENTION

It is an object of the invention to improve the above-mentioned receiver so that the search action can remain rapid and can yet not be stopped on tuning to a transmitter the frequency of which does not correspond to the tuning datum the receiver is tuned to.

A receiver of the above-mentioned type is characterized in that the receiver contains means for influencing the reception condition signal thus by a signal obtained from a frequency detector, and in that the field strength-dependent signal which causes the search action to be stopped temporarily, and the signal obtained from the frequency detector, can cause the search action to be restarted when the frequency of the received tuner does not correspond to the frequency determined by the tuning datum.

The bandwidth of a frequency detector can be chosen sufficiently wide to enable the rapid supply of a signal. In this manner a sufficiently accurate criterium is rapidly obtained as regards the agreement of the frequency of the received transmitter to the tuning datum.

BRIEF DESCRIPTION OF THE DRAWINGS

The invention will now be further explained with reference to the accompanying drawing, the sole FIGURE of which shows a block diagram of a receiver according to the invention.

Details which are not important for a proper understanding of the invention are not shown in the FIGURE.

DESCRIPTION OF THE PREFERRED EMBODIMENT

An aerial signal is applied to an input 1 of a high-frequency and mixing section 3 of the receiver and a signal originating from an oscillator 7 to an input 5 thereof. An intermediate frequency signal is obtained from an output 9 of the high-frequency and mixing section 3 and applied to an intermediate frequency amplifier 11.

The oscillator 7 forms part of a frequency synthesizing circuit which is tuned by applying, to an input combination 13 of a frequency divider 15, a tuning datum in the form of a digital code by means of which the number is adjusted by which the divider divides the frequency of a signal originating from the oscillator 7 and being applied to an input 17. A signal, the frequency of which is determined by the oscillator frequency and the number by which the divider 15 divides is obtained from an output 19 of the frequency divider 15. In a phase detector 21 this signal is compared with a reference signal coming from a reference oscillator 23 and its frequency and its phase is made equal thereto by means of a control signal obtained from a control signal output 25 of the phase detector 21 and applied to a control signal input 27 of the oscillator 7. In response thereto the receiver is tuned to a frequency determined by the tuning datum.

The tuning datum applied to the output combination 13 of the frequency divider 15 originates from an output combination 29 or 31 of a storage circuit 33, which can be connected to the input combination 13 of the frequency divider 15 via circuits gate circuit 35 and 37, respectively.

The storage circuit 33 comprises two circulating stores 39, 41, each comprising a group of tuning data and each offering each time a different tuning datum to each of the output combinations 29, 31 under the influence of a clock pulse to be applied to an input 42 of the storage circuit 33. The tuning data in a group have, for example, been chosen so that they can tune the receiver to transmitters which have the same character, such as, for example, transmitters broadcasting the same type programming.

So, by means of the gate circuits 35, 37 a selection can be made from which circulating store and, consequently, from which group the tuning data are applied to the frequency divider 15. This is effected by means of a switching signal obtained from a switch 43 or 45 of a control device 47 when the relevant switch is closed. An OR-gate 48 then ensures that a signal is applied to an AND-gate 49, so that clock pulses obtained from a clock signal generator 51 are applied to the input 42 of the storage circuit 33 via this AND-gate 49 when a reception condition signal corresponding to logic one is applied to a third input of the AND-gate 49. This signal is obtained from an OR-gate 53.

The closing of one of the switches 43 and 45 initiates a search action, which causes the tuning data of a group to tune the receiver successively to frequencies corresponding to those tuning data. The search action stops when the reception condition signal coming from the OR-gate 53 becomes logic zero.

Let us now consider how the reception condition signal is produced at the output of the OR-gate 53. On receipt of a transmitter signal the intermediate frequency section 11 supplies an intermediate frequency signal to an amplitude detector 54 and to a frequency detector 55. The amplitude detector 54 has an outpt 57 which supplies a rectified, intermediate frequency signal to an input 59 of a limiter 61. The limiter 61 converts the output signal of the amplitude detector 54 into a logic signal which appears at an output 63 of the limiter 61 and is applied to an inverting input of the OR-gate 53 and to an input of an AND-gate 65. This logic signal will be denoted a hereinafter and has a value one if the received transmitter has a sufficient field strength and is located within the bandwidth of the intermediate frequency amplifier 11. If the receiver is an F.M. receiver, the bandwidth is large and the signal a very rapidly becomes one if such a transmitter is received.

The signal at the output 57 of the amplitude detector 54 is further applied to an input 71 of a limiter 73 via a delay circuit formed by a resistor 67 and a capacitor 69. At an output 75 the limiter 73 produces a logic signal denoted b hereinafter and applied to an input of an AND-gate 77. This signal b is somewhat delayed relative to the signal a.

The frequency detector 55 has two outputs 81, 83 at which signals appear from which unwanted alternating current components have been removed. These signals have an opposite polarity with respect to a reference level and have the known S-shape as a function of the frequency.

These signals are applied via two diodes 85, 87 to an input 89 of a limiter 91 which supplies at an output 93 a logic signal denoted c and which is "1" outside the pass region of the intermediate frequency amplifier 11 and in a very small frequency range around the intermediate frequency. This signal c is applied to a further input of the AND-gate 65 and to an inverting further input of the AND-gate 77. This AND-gate 77 supplies a logic signal bc' which is applied to a further input of the OR-gate 53.

The OR-gate 53 supplies the reception condition signal having the logic formula a'+bc'. If no transmitter is received, the signals a and b are zero and c is one, the reception condition signal a'+bc' is then one and the AND-gate 49 passes a clock signal when one of the switches 43, 45 is closed. The receiver then performs a search action. On receipt of a transmitter which supplies an intermediate frequency signal, a becomes one and b remains zero for a short time thereafter. The reception condition signal a'+bc' becomes zero and the search action stops. The time constant of the network comprising the resistor 67 and the capacitor 69 is so that b becomes one when the control loop of the frequency synthesizer circuit has come in the rest condition and the receiver is, consequently, properly tuned to a frequency corresponding to a tuning datum from the selected group. The reception condition signal a'+bc' then becomes zero in response to the signal c when the transmitter has the proper intermediate frequency. The search action is then stopped permanently. If the received transmitter has a frequency which deviates somewhat from the intermediate frequency, the signal c becomes zero and the reception condition signal a'+bc' becomes one and the search action is immediately started again.

So the search action is only stopped permanently on receipt of a transmitter having a sufficient field strength and being of the proper frequency. If a transmitter is received which has a sufficient field strength but a slightly deviating frequency, the search action is only stopped temporarily during the very brief period of time required for tuning the receiver to the frequency determined by the tuning datum.

The frequency detector 55 has a further output 93 which produces a low frequency signal which is applied to a low frequency reproduction section 97 via a switch 95. The switch 95 is operated by the output signal ac of the AND-gate 65 and is therefore closed only when the received transmitter has the proper frequency.

It will be apparent that the receiver can, if so desired, also be suitable for tuning to other tuning data than those stored in the storage circuit 33. This is shown in the FIGURE by means of dotted lines.

Although a frequency synthesizing circuit having an adjustable divider is shown in the receiver of the embodiment it is obvious that a different type of frequency synthesizing circuit can alternatively be used. In general, each tuning circuit which does not require an automatic frequency control by means of an output signal of the intermediate frequency section will be sufficient.

Several functions which can be performed simultaneously in the receiver of the above-described example can of course also be performed sequentially, for example when the receiver is provided with a micro-processor.

Although the search tuning circuit is particularly suitable for FM radio broadcast receivers and for vehicle receivers in particular, the field of application need not be limited thereto.

It will furthermore be obvious that several other combinations of gates, detection circuits and limiters are possible to perform the functions according to the invention. The reception condition signal or the composite portions thereof can, for example, also be applied together with the other signals to the AND-gate 49 and the OR-gate 48 to be combined in other manners.

Any detector capable of accurately determining a frequency datum without bandwidth limiting means can be used as the frequency detector.

If desired, the storage circuit of the receiver may comprise one or more groups of tuning data.

What is claimed is:

1. A tuning circuit for a receiver comprising:
    memory means which includes a plurality of scannable groups of tuning data, each tuning datum representing a frequency of a desired radio transmitter, said memory means further including a separate output for each of said groups;
    search means coupled to said memory means for incrementally selecting a tuning datum of said tuning data in each of said scannable groups;
    a scannable group selection means coupled to said separate outputs for selecting one of said scannable groups, said receiver then being tuned to said selected tuning datum in said selected scannable group;
    means coupled to said search means for stopping the incremental scanning upon the reception of a received signal having sufficient field strength; and
    means for automatically restarting said seach means if the frequency of the received signal does not correspond to said tuning datum selected by said search means from the tuning data in said selected scannable group.

2. A tuning circuit as claimed in claim 1, wherein said memory means comprises a plurality of circulating stores each of which having respectively one of said groups of tuning data stored therein.

3. A tuning circuit as claimed in claim 2, wherein said search means comprises a clock signal generator and a gate coupling said generator to said circulating stores wherein a pulse from said clock generator causes the incremental reading of the tuning data in said circulating stores.

4. A tuning circuit as claimed in claim 1, wherein said means for stopping the incremental scanning comprises an amplitude detector for measuring the signal strength of a received signal, said amplitude detector being arranged to supply a control signal indicative of said signal strength.

5. A tuning circuit as claimed in claim 1, wherein said automatic restarting means comprises a frequency detector for measuring the amount of deviation, if any, of the frequency of said received signal from the frequency of the selected tuning datum.

* * * * *